US012453013B2

(12) United States Patent
Fukushima et al.

(10) Patent No.: US 12,453,013 B2
(45) Date of Patent: Oct. 21, 2025

(54) METHOD FOR PRODUCING WIRING CIRCUIT BOARD AND WIRING CIRCUIT BOARD

(71) Applicant: NITTO DENKO CORPORATION, Osaka (JP)

(72) Inventors: Kenta Fukushima, Osaka (JP); Hayato Takakura, Osaka (JP); Naoki Shibata, Osaka (JP); Ryosuke Sasaoka, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 216 days.

(21) Appl. No.: 18/471,046

(22) Filed: Sep. 20, 2023

(65) Prior Publication Data

US 2024/0114628 A1  Apr. 4, 2024

(30) Foreign Application Priority Data

Sep. 26, 2022 (JP) .................................. 2022-152343

(51) Int. Cl.
H05K 3/10 (2006.01)
H05K 1/02 (2006.01)
H05K 1/05 (2006.01)
H05K 3/00 (2006.01)
H05K 3/32 (2006.01)

(52) U.S. Cl.
CPC ........... *H05K 3/103* (2013.01); *H05K 1/0296* (2013.01); *H05K 3/0017* (2013.01); *H05K 3/32* (2013.01); *H05K 2201/10287* (2013.01)

(58) Field of Classification Search
CPC ................. H05K 3/103; H05K 1/0296; H05K 2201/10287; H05K 1/05
See application file for complete search history.

(56) References Cited

U.S. PATENT DOCUMENTS

| 7,336,446 B2 * | 2/2008 | Kanagawa | H05K 3/4092 360/245.9 |
| 2017/0229635 A1 * | 8/2017 | Takano | H05K 3/3463 |
| 2021/0212208 A1 * | 7/2021 | Shibata | H05K 1/118 |
| 2022/0053111 A1 | 2/2022 | Sommer et al. | |

FOREIGN PATENT DOCUMENTS

| JP | 2018-207083 A | 12/2018 |
| JP | 2019-212656 A | 12/2019 |
| JP | 2022-147128 A | 10/2022 |

* cited by examiner

*Primary Examiner* — Sherman Ng
(74) *Attorney, Agent, or Firm* — Edwards Neils LLC; Jean C. Edwards, Esq.

(57) ABSTRACT

A method for producing a wiring circuit board includes a preparation step of preparing a substrate; a first patterning step of forming a first insulating layer on one side of the substrate in a thickness direction; a second patterning step of forming a conductive pattern on one side of the first insulating layer in the thickness direction; and a deposition step of depositing a metal on the other side of the substrate in the thickness direction and forming a first metal support layer. The conductive pattern has two terminals, and two wirings. The first metal support layer has a terminal support portion supporting the terminals, a wiring support portion supporting one of the wirings, and a second wiring support portion supporting the other wiring and disposed spaced from the wiring support portion.

8 Claims, 9 Drawing Sheets

METHOD FOR PRODUCING WIRING CIRCUIT BOARD AND WIRING CIRCUIT BOARD

CROSS-REFERENCE TO RELATED APPLICATION

The present application claims priority from Japanese Patent Application No. 2022-152343 filed on Sep. 26, 2022, the contents of which are hereby incorporated by reference into this application.

TECHNICAL FIELD

The present invention relates to a method for producing a wiring circuit board and a wiring circuit board.

BACKGROUND ART

Conventionally, in a wiring circuit board including a metal-based support layer which functions as a heat sink, it has been proposed to improve heat dissipation by providing a first connecting body, a second connecting body disposed away from the first connecting body, and a plurality of wiring bodies disposed between the first connecting body and the second connecting body and disposed spaced from each other (ref: for example, Patent Document 1 below).

CITATION LIST

Patent Document

Patent Document 1: Japanese Unexamined Patent Publication No. 2019-212656

SUMMARY OF THE INVENTION

Problem to be Solved by the Invention

In the wiring circuit board described in the above-described Patent Document 1, a further fine pitch of the wiring body is desired.

The present invention provides a method for producing a wiring circuit board which is capable of achieving a fine pitch of a wiring support portion, and a wiring circuit board.

Means for Solving the Problem

The present invention [1] includes a method for producing a wiring circuit board including a preparation step of preparing a substrate; a first patterning step of forming an insulating layer on one side of the substrate in a thickness direction; a second patterning step of forming a conductive pattern on one side of the insulating layer in the thickness direction, the conductive pattern having a first terminal, a second terminal, a first wiring connected to the first terminal, and a second wiring connected to the second terminal and disposed spaced from the first wiring; and a deposition step of depositing a metal on the other side of the substrate in the thickness direction to form a first metal support layer having a terminal support portion supporting the first terminal and the second terminal, a first wiring support portion supporting the first wiring, and a second wiring support portion supporting the second wiring and disposed spaced from the first wiring support portion.

According to such a method, by depositing the metal, the first metal support layer is patterned into a predetermined shape (shape having the terminal support portion, the first wiring support portion, and the second wiring support portion).

Therefore, as compared with a case of patterning the first metal support layer by removing the metal by a method such as etching, it is possible to stably obtain the first metal support layer in a desired shape without excessively removing the metal.

As a result, it is possible to achieve a fine pitch of the wiring support portion.

The present invention [2] includes the method for producing a wiring circuit board of the above-described [1] further including an etching step of etching the substrate to form a second metal support layer disposed between the first metal support layer and the insulating layer after the deposition step.

According to such a method, after forming the first metal support layer into the desired shape, it is possible to pattern the second metal support layer by a simple method.

The present invention [3] includes the method for producing a wiring circuit board of the above-described [1] or [2] further including a bonding layer forming step of forming a bonding layer made of a metal on the other surface of the substrate in the thickness direction before the deposition step, wherein in the deposition step, the first metal support layer is formed on the bonding layer.

According to such a method, it is possible to ensure bondability between the first metal support layer and the second metal support layer.

The present invention [4] includes the method for producing a wiring circuit board of the above-described [2] further including a thinning step of reducing a thickness of the substrate before the deposition step.

According to such a method, in the etching step, by etching the thinned substrate, it is possible to form the second metal support layer.

Therefore, it is possible to shorten the etching step.

The present invention [5] includes the method for producing a wiring circuit board of the above-described [4], wherein the substrate has a first region in which the terminal support portion is formed and a second region in which the first wiring support portion and the second wiring support portion are formed, and in the thinning step, a thickness of the second region is reduced without reducing the thickness of the first region.

According to such a method, it is possible to shorten the etching step without reducing rigidity of the first region which supports the terminal.

The present invention [6] includes a wiring circuit board including an insulating layer; a conductive pattern disposed on one side of the insulating layer in a thickness direction and having a first terminal, a second terminal, a first wiring connected to the first terminal, and a second wiring connected to the second terminal and disposed spaced from the first wiring; a first metal support layer disposed on the other side of the insulating layer in the thickness direction and having a terminal support portion supporting the first terminal and the second terminal, a first wiring support portion supporting the first wiring, and a second wiring support portion supporting the second wiring and disposed spaced from the first wring support portion; and a second metal support layer disposed between the first metal support layer and the insulating layer, wherein the first metal support layer is thicker than the second metal support layer.

According to such a configuration, it is possible to form the thick metal layer consisting of the second metal support layer, and the first metal support layer which is thicker than the second metal support layer on the other side of the insulating layer in the thickness direction.

Thus, it is possible to ensure heat dissipation of the wiring circuit board.

Furthermore, since the wiring circuit board of such a configuration can be produced using the above-described production method, it is also possible to achieve the fine pitch of the wiring support portion.

The present invention [7] includes the wiring circuit board of the above-described [6], wherein a width of the second metal support layer is wider than the width of each of the first wiring support portion and the second wiring support portion on each of the first wiring support portion and the second wiring support portion.

According to such a configuration, it is possible to stably support the wiring support portion by the second metal support layer.

The present invention [8] includes the wiring circuit board of the above-described [6] or [7] further having a bonding layer disposed between the first metal support layer and the second metal support layer.

According to such a configuration, it is possible to ensure the bondability between the first metal support layer and the second metal support layer.

Effect of the Invention

According to a method for producing a wiring circuit board and a wiring circuit board of the present invention, it is possible to achieve a fine pitch of a wiring support portion.

BRIEF DESCRIPTION OF THE DRAWINGS

FIGS. 4A to 4D show process views for illustrating a method for producing a wiring circuit board:
  FIG. 4A illustrating a preparation step,
  FIG. 4B illustrating a first pattern step,
  FIG. 4C illustrating a second pattern step, and
  FIG. 4D illustrating a third pattern step.

FIGS. 5A to 5C show process views for illustrating the method for producing a wiring circuit board subsequent to FIG. 4D:
  FIG. 5A illustrating a bonding layer forming step,
  FIG. 5B illustrating a deposition step, and
  FIG. 5C illustrating an etching step.

FIGS. 6A to 6D show process views for illustrating the method for producing a wiring circuit board of a modified example (1) subsequent to FIG. 4D:
  FIG. 6A illustrating a thinning step,
  FIG. 6B illustrating a bonding layer forming step,
  FIG. 6C illustrating a deposition step, and
  FIG. 6D illustrating an etching step.

DESCRIPTION OF EMBODIMENTS

1. Wiring Circuit Board

A wiring circuit board 1 is described with reference to FIGS. 1 to 3.

Figure 1:
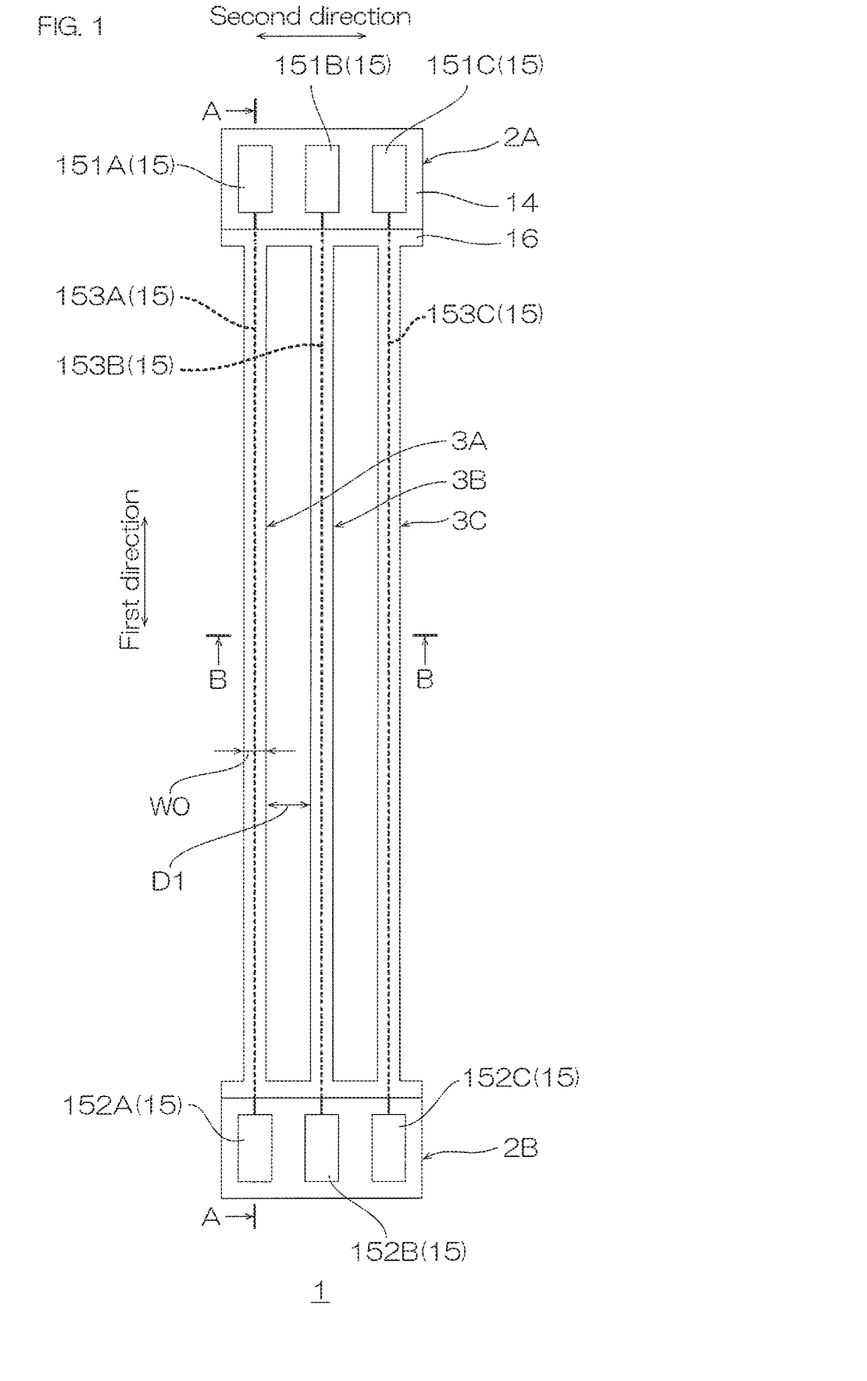
FIG. 1 shows a plan view of a wiring circuit board as one embodiment of the present invention.

As shown in FIG. 1, the wiring circuit board 1 has two terminal arrangement portions 2A and 2B, and a plurality of connecting portions 3A, 3B, and 3C. The terminal arrangement portions 2A and 2B are disposed spaced from each other in a first direction. The first direction is perpendicular to a thickness direction of the wiring circuit board 1. Each of the terminal arrangement portions 2A and 2B extends in a second direction. The second direction is perpendicular to both the first direction and the thickness direction. In the terminal arrangement portion 2A, terminals 151A, 151B, and 151C of a conductive pattern 15 to be described later are disposed. In the terminal arrangement portion 2B, terminals 152A, 152B, and 152C of the conductive pattern 15 to be described later are disposed.

The connecting portions 3A, 3B, and 3C connect the terminal arrangement portion 2A to the terminal arrangement portion 2B. The connecting portions 3A, 3B, and 3C are disposed between the terminal arrangement portion 2A and the terminal arrangement portion 2B in the first direction. In the present embodiment, each of the connecting portions 3A, 3B, and 3C extends in the first direction. One end portion of each of the connecting portions 3A, 3B, and 3C in the first direction is connected to the terminal arrangement portion 2A. The other end portion of each of the connecting portions 3A, 3B, and 3C in the first direction is connected to the terminal arrangement portion 2B. A shape of each of the connecting portions 3A, 3B, and 3C is not limited. Each of the connecting portions 3A, 3B, and 3C may be a linear shape or a curved shape. The connecting portions 3A, 3B, and 3C are disposed spaced from each other in the second direction. In other words, the connecting portions 3A, 3B, and 3C are disposed spaced from each other in a direction perpendicular to a direction in which the connecting portion 3A extends. In the connecting portion 3A, a wiring 153A of the conductive pattern 15 to be described later is disposed. In the connecting portion 3B, a wiring 153B of the conductive pattern 15 to be described later is disposed. In the connecting portion 3C, a wiring 153C of the conductive pattern 15 to be described later is disposed.

A width W0 of each of the connecting portions 3A, 3B, and 3C is, for example, 300 μm or less, preferably 250 μm or less. The width W0 is, for example, 10 μm or more, preferably 50 μm or more.

The "width" refers to the maximum length in a direction perpendicular to both a direction in which the connecting portion extends and the thickness direction. For example, the "width" of the connecting portion 3A refers to the maximum length in a direction perpendicular to both a direction in which the connecting portion 3A extends and the thickness direction. In the present embodiment, the "width" refers to the maximum length in the second direction.

An interval D1 of each of the connecting portions 3A, 3B, and 3C is, for example, 300 µm or less, preferably 250 µm or less. The interval D1 is, for example, 5 µm or more, preferably 10 µm or more.

Figure 2A:
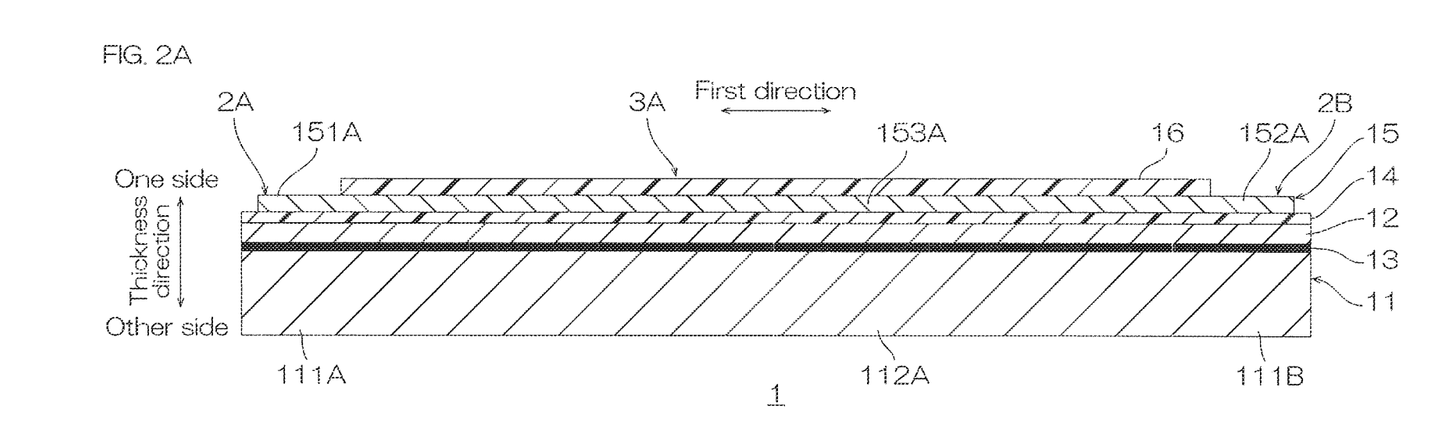
FIG. 2A shows an A-A cross-sectional view of the wiring circuit board shown in FIG. 1.
Figure 2B:
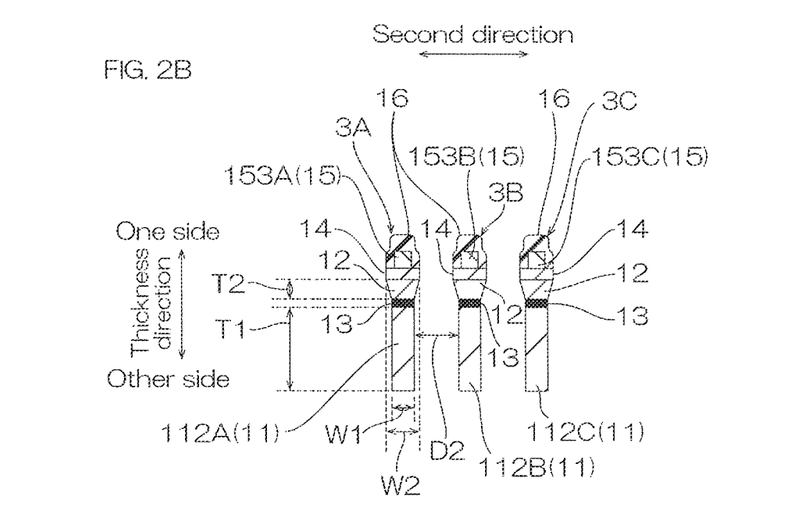
FIG. 2B shows a B-B cross-sectional view of the wiring circuit board shown in FIG. 1.

As shown in FIGS. 2A and 2B, the wiring circuit board 1 includes a first metal support layer 11, a second metal support layer 12, a bonding layer 13, a first insulating layer 14 as one example of the insulating layer, the conductive pattern 15, and a second insulating layer 16.

(1) First Metal Support Layer

The first metal support layer 11, together with the second metal support layer 12, supports the first insulating layer 14, the conductive pattern 15, and the second insulating layer 16. The first metal support layer 11 is disposed on the other side of the first insulating layer 14 in the thickness direction. The first metal support layer 11 is disposed away from the first insulating layer 14 in the thickness direction. The first metal support layer 11 is made of a metal. Examples of a material for the first metal support layer 11 include copper, nickel, cobalt, iron, and alloys of these. Examples of the alloy include copper alloys. As the material for the first metal support layer 11, preferably, a copper alloy is used.

A thickness T1 of the first metal support layer 11 is, for example, 10 µm or more, preferably 50 µm or more, and for example, 300 µm or less, preferably 250 µm or less. The first metal support layer 11 is preferably thicker than the second metal support layer 12.

A ratio (T1/T2) of the thickness T1 of the first metal support layer 11 to a thickness T2 of the second metal support layer 12 is, for example, 1.5 or more, preferably 2 or more, more preferably 4 or more, and for example, 20 or less, preferably 10 or less.

Figure 3:
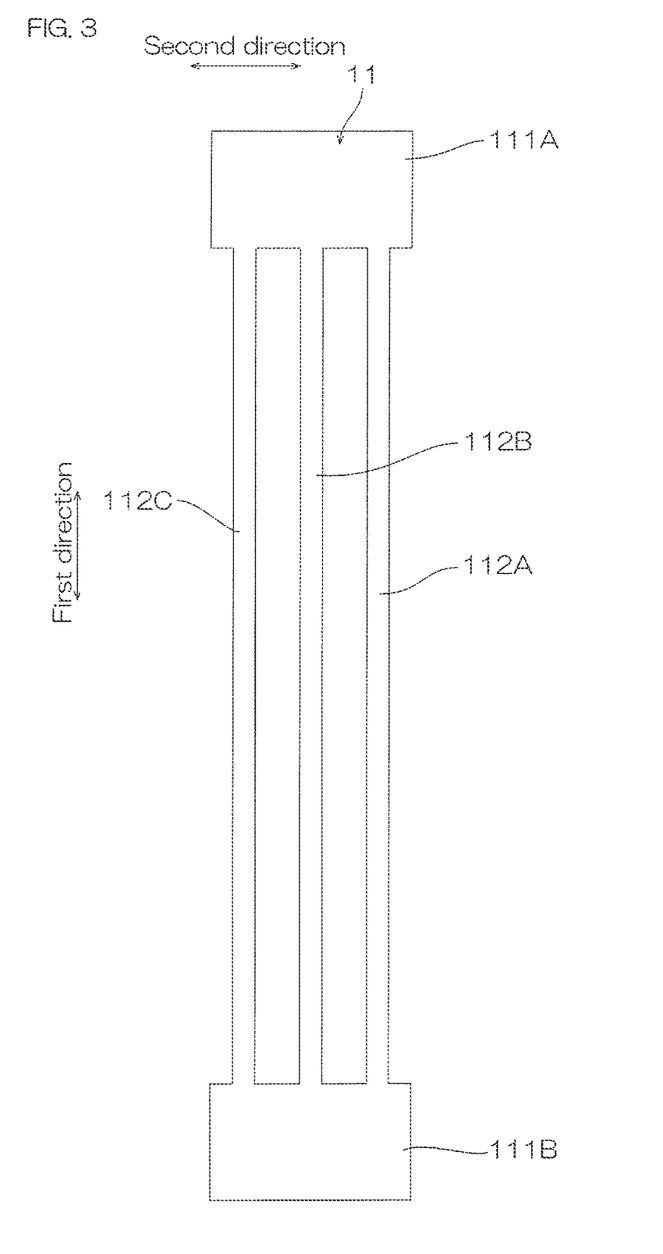
FIG. 3 shows a reverse-side view of the wiring circuit board shown in FIG. 1.

As shown in FIG. 3, the first metal support layer 11 has two terminal support portions 111A and 111B and a plurality of wiring support portions 112A, 112B, and 112C.

The terminal support portion 111A is the first metal support layer 11 of the terminal arrangement portion 2A (ref: FIG. 1). The terminal support portion 111A supports at least the terminals 151A, 151B, and 151C of the conductive pattern 15. The terminal support portion 111A may support a portion of each of the wirings 153A, 153B, and 153C of the conductive pattern 15.

The terminal support portion 111B is the first metal support layer 11 of the terminal arrangement portion 2B (ref: FIG. 1). The terminal support portion 111B is disposed spaced from the terminal support portion 111A in the first direction. The terminal support portion 111B supports at least the terminals 152A, 152B, and 152C of the conductive pattern 15. The terminal support portion 111B may support a portion of each of the wirings 153A, 153B, and 153C of the conductive pattern 15.

The wiring support portion 112A is the first metal support layer 11 of the connecting portion 3A (ref: FIG. 1). The wiring support portion 112A connects the terminal support portion 111A to the terminal support portion 111B. The wiring support portion 112A is disposed between the terminal support portion 111A and the terminal support portion 111B in the first direction. The wiring support portion 112A extends in the first direction. One end portion of the wiring support portion 112A in the first direction is connected to the terminal support portion 111A. The other end portion of the wiring support portion 112A in the first direction is connected to the terminal support portion 111B. The wiring support portion 112A supports the wiring 153A (ref: FIG. 1).

The wiring support portion 112B is the first metal support layer 11 of the connecting portion 3B (ref: FIG. 1). The wiring support portion 112B connects the terminal support portion 111A to the terminal support portion 111B. The wiring support portion 112B is disposed between the terminal support portion 111A and the terminal support portion 111B in the first direction. The wiring support portion 112B extends in the first direction. One end portion of the wiring support portion 112B in the first direction is connected to the terminal support portion 111A. The other end portion of the wiring support portion 112B in the first direction is connected to the terminal support portion 111B. The wiring support portion 112B supports the wiring 153B (ref: FIG. 1). The wiring support portion 112B is disposed spaced from the wiring support portion 112A in the second direction.

The wiring support portion 112C is the first metal support layer 11 of the connecting portion 3C (ref: FIG. 1). The wiring support portion 112C connects the terminal support portion 111A to the terminal support portion 111B. The wiring support portion 112C is disposed between the terminal support portion 111A and the terminal support portion 111B in the first direction. The wiring support portion 112C extends in the first direction. One end portion of the wiring support portion 112C in the first direction is connected to the terminal support portion 111A. The other end portion of the wiring support portion 112C in the first direction is connected to the terminal support portion 111B. The wiring support portion 112C supports the wiring 153C (ref: FIG. 1). The wiring support portion 112C is disposed spaced from the wiring support portion 112B in the second direction.

As shown in FIG. 2B, a width W1 of each of the wiring support portions 112A, 112B, and 112C is, for example, 300 µm or less, preferably 250 µm or less. The width W1 of each of the wiring support portions 112A, 112B, and 112C is preferably narrower than the width W0 of each of the connecting portions 3A, 3B, and 3C (ref: FIG. 1). The width W1 of each of the wiring support portions 112A, 112B, and 112C is, for example, 5 µm or more, preferably 10 µm or more.

The ratio (T1/W1) of the thickness T1 of the first metal support layer 11 to the width W1 of each of the wiring support portions 112A, 112B, and 112C is, for example, 1 or more, preferably 5 or more. When the ratio (T1/W1) is the above-described lower limit value or more, it is possible to improve heat dissipation. The ratio (T1/W1) is, for example, 30 or less, preferably 10 or less. When the ratio (T1/W1) is the above-described upper limit value or less, it is possible to suppress a reduction in support strength.

An interval D2 of each of the wiring support portions 112A, 112B, and 112C is, for example, 300 µm or less, preferably 250 µm or less. The interval D2 is, for example, 5 µm or more, preferably 10 µm or more. The interval D2 is preferably longer than the interval D1. Since the interval D2 is longer than the interval D1, it is possible to ensure the heat dissipation from space between the wiring support portion 112A and the wiring support portion 112B, and space between the wiring support portion 112B and the wiring support portion 112C.

(2) Second Metal Support Layer

As shown in FIGS. 2A and 2B, the second metal support layer 12 is disposed on the other side of the first insulating layer 14 in the thickness direction. The second metal support layer 12 is disposed on the other surface of the first insulating layer 14 in the thickness direction. The second metal support layer 12 is disposed between the first metal support layer 11 and the first insulating layer 14 in the thickness direction. The second metal support layer 12 is made of a metal. Examples of the material for the second metal support layer 12 include copper, copper alloys, stainless steel, nickel, titanium, and 42-alloy. The material for the second metal support layer 12 may be the same as or different from the material for the first metal support layer 11. As the material for the second metal support layer 12, preferably, a copper alloy is used.

The thickness T2 of the second metal support layer 12 is, for example, 5 μm or more, preferably 10 μm or more, and for example, 100 μm or less, preferably 50 μm or less.

A width W2 of the second metal support layer 12 of each of the connecting portions 3A, 3B, and 3C is, for example, 300 μm or less, preferably 250 μm or less. The width W2 of the second metal support layer 12 of each of the connecting portions 3A, 3B, and 3C is preferably the width W0 of each of the connecting portions 3A, 3B, and 3C or less.

The width W2 of the second metal support layer 12 of each of the connecting portions 3A, 3B, and 3C is, for example, 10 μm or more, preferably 50 μm or more.

The width W2 of the second metal support layer 12 of each of the connecting portions 3A, 3B, and 3C is preferably wider than the width W1 of each of the wiring support portions 112A, 112B, and 112C. That is, the width W2 of the second metal support layer 12 is wider than the width W1 of each of the wiring support portions 112A, 112B, and 112C on each of the wiring support portions 112A, 112B, and 112C.

(3) Bonding Layer

The bonding layer 13 is, if necessary, disposed between the first metal support layer 11 and the second metal support layer 12 in the thickness direction. The bonding layer 13 is disposed on the other surface of the second metal support layer 12 in the thickness direction. The bonding layer 13 is in contact with one surface of the first metal support layer 11 in the thickness direction. The bonding layer 13 ensures the bondability of the first metal support layer 11 with respect to the second metal support layer 12. The bonding layer 13 is made of the metal. Examples of the material for the bonding layer 13 include copper, chromium, nickel, and cobalt.

The thickness of the bonding layer 13 is, for example, 0.05 μm or more, preferably 0.1 μm or more, and for example, 50 μm or less, preferably 10 μm or less.

(4) Insulating Layer

The first insulating layer 14 is disposed on one side of the second metal support layer 12 in the thickness direction. The first insulating layer 14 is disposed on one surface of the second metal support layer 12 in the thickness direction. The first insulating layer 14 is disposed between the second metal support layer 12 and the conductive pattern 15. The first insulating layer 14 insulates the second metal support layer 12 from the conductive pattern 15. The first insulating layer 14 is made of a resin. Examples of the resin include polyimide, maleimide, epoxy resins, polybenzoxazole, and polyester.

(5) Conductive Pattern

The conductive pattern 15 is disposed on one side of the first insulating layer 14 in the thickness direction. The conductive pattern 15 is disposed on one surface of the first insulating layer 14 in the thickness direction. The conductive pattern 15 is disposed on the opposite side of the first metal support layer 11 and the second metal support layer 12 with respect to the first insulating layer 14 in the thickness direction. The conductive pattern 15 is made of the metal. Examples of the metal include copper, silver, gold, iron, aluminum, chromium, and alloys of these. From the viewpoint of obtaining excellent electrical properties, preferably, copper is used. A shape of the conductive pattern 15 is not limited.

As shown in FIG. 1, the conductive pattern 15 has the plurality of terminals 151A, 151B, and 151C, the plurality of terminals 152A, 152B, and 152C, and the plurality of wirings 153A, 153B, and 153C.

The terminals 151A, 151B, and 151C are disposed on the terminal arrangement portion 2A. Each of the terminals 151A, 151B, and 151C has a square land shape. The terminals 151A, 151B, and 151C are disposed spaced from each other in the second direction.

The terminals 152A, 152B, and 152C are disposed on the terminal arrangement portion 2B. Each of the terminals 152A, 152B, and 152C has a square land shape. The terminals 152A, 152B, and 152C are disposed spaced from each other in the second direction.

The wiring 153A electrically connects the terminal 151A to the terminal 152A. One end portion of the wiring 153A is connected to the terminal 151A. The other end portion of the wiring 153A is connected to the terminal 152A. At least a portion of the wiring 153A is disposed on the connecting portion 3A.

The wiring 153B electrically connects the terminal 151B to the terminal 152B. One end portion of the wiring 153B is connected to the terminal 151B. The other end portion of the wiring 153B is connected to the terminal 152B. At least a portion of the wiring 153B is disposed on the connecting portion 3B. The wiring 153B is disposed spaced from the wiring 153A in the second direction.

The wiring 153C electrically connects the terminal 151C to the terminal 152C. One end portion of the wiring 153C is connected to the terminal 151C. The other end portion of the wiring 153C is connected to the terminal 152C. At least a portion of the wiring 153C is disposed on the connecting portion 3C. The wiring 153C is disposed spaced from the wiring 153B in the second direction.

(6) Second Insulating Layer

As shown in FIG. 2B, the second insulating layer 16 covers all of the wirings 153A, 153B, and 153C. The second insulating layer 16 is disposed on the first insulating layer 14 in the thickness direction. As shown in FIGS. 1 and 2A, the second insulating layer 16 does not cover the terminals 151A, 151B, and 151C and the terminals 152A, 152B, and 152C. The second insulating layer 16 is made of the resin. Examples of the resin include polyimide, maleimide, epoxy resins, polybenzoxazole, and polyester.

2. Method for Producing Wiring Circuit Board

Next, a method for producing the wiring circuit board 1 is described with reference to FIGS. 4A to 5C.

Figure 4A:
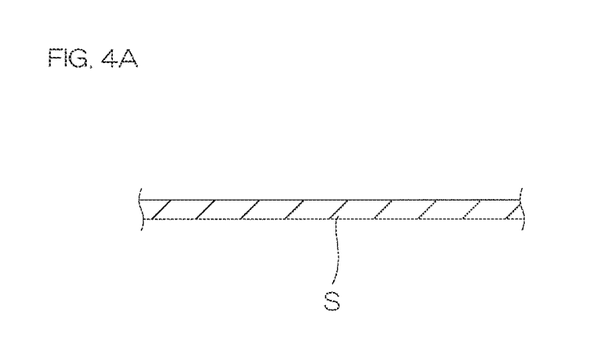
Figure 4B:
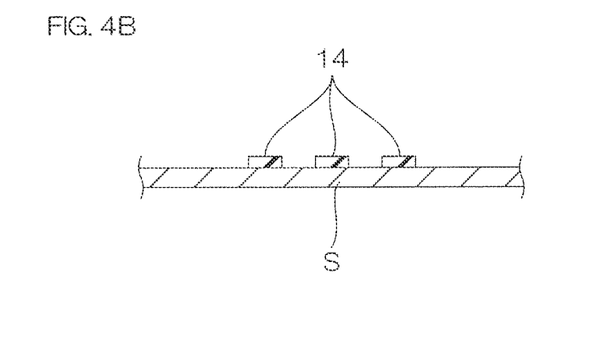
Figure 4C:
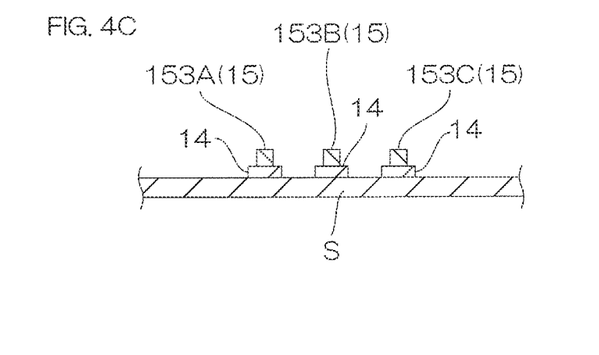
Figure 4D:
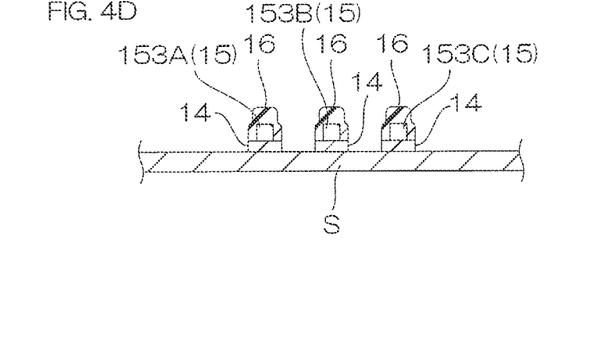
Figure 5A:
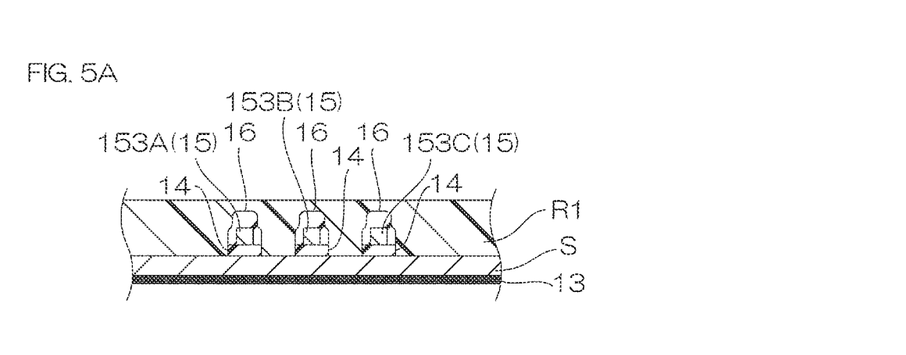
Figure 5B:
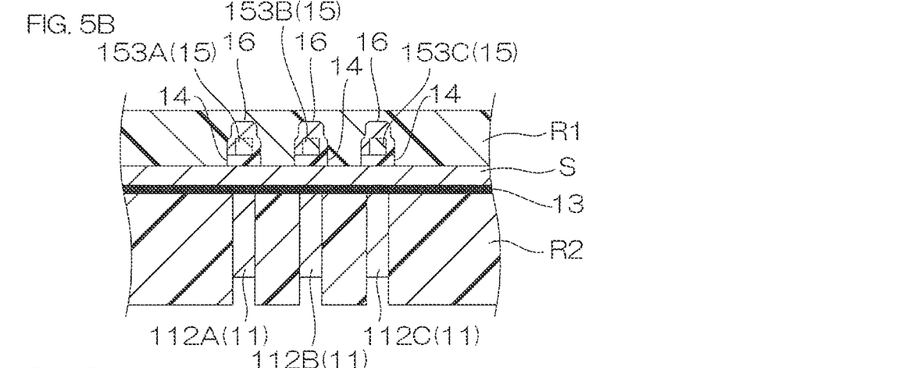
Figure 5C:
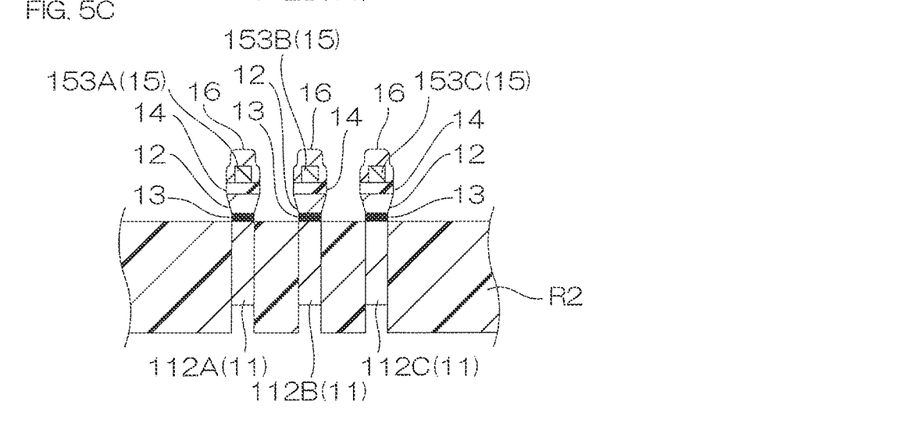

The method for producing the wiring circuit board 1 includes a preparation step (ref: FIG. 4A), a first patterning step (ref: FIG. 4B), a second patterning step (ref: FIG. 4C), a third patterning step (ref: FIG. 4D), a bonding layer forming step (ref: FIG. 5A), a deposition step (ref: FIG. 5B), and an etching step (ref: FIG. 5C). The bonding layer forming step is, if necessary, carried out.

(1) Preparation Step

As shown in FIG. 4A, in the preparation step, a substrate S is prepared. In the present embodiment, the substrate S is a metal foil drawn from a roll of the metal foil. The material for the substrate S is the same as that of the second metal support layer 12.

(2) First Patterning Step

As shown in 4B, in the first patterning step, the first insulating layer 14 is formed on one side of the substrate S in the thickness direction. In the first patterning step, the first insulating layer 14 is formed on one surface of the substrate S in the thickness direction.

In order to form the first insulating layer 14, first, a solution (varnish) of a photosensitive resin is coated onto the substrate S and dried to form a coating film of the photosensitive resin. Next, the coating film of the photosensitive resin is exposed to light and developed. Thus, the first insulating layer 14 is formed into a predetermined pattern on the substrate S.

(3) Second Patterning Step

As shown in FIG. 4C, in the second patterning step, the conductive pattern 15 is formed on one side of the first insulating layer 14 in the thickness direction by electrolytic plating.

Specifically, first, a seed layer is formed on the surfaces of the first insulating layer 14 and the substrate S. The seed layer is, for example, formed by sputtering. Examples of the material for the seed layer include chromium, copper, nickel, titanium, and alloys of these.

Next, a plating resist is attached onto the first insulating layer 14 and the substrate S on which the seed layer is formed, and the plating resist is exposed to light in a state of shielding a portion where the conductive pattern 15 is formed.

Next, the exposed plating resist is developed. Then, the plating resist of the shielded portion is removed, and the seed layer is exposed in a portion where the conductive pattern 15 is formed. The plating resist of the exposed portion, that is, the portion where the conductive pattern 15 is not formed remains.

Next, the conductive pattern 15 is formed on the exposed seed layer by the electrolytic plating.

After the electrolytic plating is completed, the plating resist is peeled. Thereafter, the seed layer exposed by the peeling is removed by etching.

(4) Third Patterning Step

Next, as shown in FIG. 4D, in the third patterning step, the second insulating layer 16 is formed on the first insulating layer 14 and the conductive pattern 15 in the same manner as in the first insulating layer 14.

Thus, a circuit pattern is formed on one surface of the substrate S in the thickness direction. After the third patterning step and before the bonding layer forming step, a terminal protecting resist which is not shown for protecting the terminals 151A, 151B, and 151C and the terminals 152A, 152B, and 152C is formed. The terminal protecting resist is formed on a portion where the terminal arrangement portions 2A and 2B are formed, and is not peeled until the etching step (ref: FIG. 5C) is completed.

(5) Bonding layer Forming Step

Next, as shown in FIG. 5A, in the bonding layer forming step, before the deposition step, the bonding layer 13 is formed on the other surface of the substrate S in the thickness direction.

The bonding layer 13 is, for example, formed by the electrolytic plating or sputtering. When the bonding layer 13 is formed by the electrolytic plating, first, a plating resist R1 is attached to one surface of the substrate S in the thickness direction so as to cover the entire circuit pattern. Next, the bonding layer 13 is formed on the entire other surface of the substrate S in the thickness direction by the electrolytic plating. When the bonding layer 13 is formed by the sputtering, the bonding layer 13 is formed on the entire other surface of the substrate S in the thickness direction by the sputtering using a target made of the above-described material for the bonding layer 13.

(6) Deposition Step

Next, as shown in FIG. 5B, in the deposition step, after the second patterning step, a metal is deposited on the other side of the substrate S in the thickness direction to form the first metal support layer 11. Specifically, the first metal support layer 11 is formed on the bonding layer 13. In the deposition step, the metal is, for example, deposited by the electrolytic plating to form the first metal support layer 11.

Specifically, first, the plating resist R2 is attached onto the bonding layer 13 without peeling the plating resist R1, and the plating resist R2 is exposed to light in a state of shielding a portion where the first metal support layer 11 is formed.

Next, the exposed plating resist R2 is developed. Then, the plating resist of the shielded portion is removed, and the bonding layer 13 is exposed in a portion where the first metal support layer 11 is formed. The plating resist R2 of the exposed portion, that is, the portion where the first metal support layer 11 is not formed remains.

Next, the metal is deposited on the exposed bonding layer 13 by the electrolytic plating.

Thus, the first metal support layer 11 is formed on the bonding layer 13.

(7) Etching Step

Next, as shown in FIG. 5C, in the etching step, after the deposition step, the substrate S is etched to form the second metal support layer 12.

Specifically, the plating resist R1 is peeled without peeling the plating resist R2, and the substrate S and the bonding layer 13 are wet-etched from one side of the substrate S in the thickness direction.

Then, the first insulating layer 14, the second insulating layer 16, and the terminal protecting resist function as an etching mask, and the substrate S and the bonding layer 13 of a portion where the first insulating layer 14, the second insulating layer 16, and the terminal protecting resist are not formed are removed.

Thus, the second metal support layer 12 is formed.

Thereafter, the plating resist R2 is peeled.

3. Function and Effect (1) According to the method of the wiring circuit board 1, as shown in FIG. 5B, by depositing the metal by the electrolytic plating, the first metal support layer 11 is patterned into a predetermined shape (shape having the terminal support portion 111A and the plurality of wiring support portions 112A, 112B, and 112C, ref: FIG. 3).

Therefore, as compared with the case of patterning the first metal support layer 11 by removing the metal by a method such as etching, it is possible to stably obtain the first metal support layer 11 in a desired shape without excessively removing the metal.

As a result, it is possible to achieve a fine pitch of the wiring support portions 112A, 112B, and 112C.

(2) According to the method of the wiring circuit board 1, as shown in FIG. 5C, after the deposition step, the substrate S is etched to form the second metal support layer 12.

Therefore, after forming the first metal support layer 11 into the desired shape, it is possible to pattern the second metal support layer 12 by a simple method.

(3) According to the method of the wiring circuit board 1, as shown in FIG. 5A, before the deposition step, the bonding layer 13 made of the metal is formed on the other surface of the substrate S in the thickness direction, and in the deposition step, the first metal support layer 11 is formed on the bonding layer 13.

Therefore, it is possible to ensure the bondability between the first metal support layer 11 and the second metal support layer 12.

(4) According to the wiring circuit board 1, as shown in FIG. 2B, a thick metal layer consisting of the second metal support layer 12 and the first metal support layer 11 which is thicker than the second metal support layer 12 is provided on the other side of the first insulating layer 14 in the thickness direction.

Thus, it is possible to ensure the heat dissipation of the wiring circuit board 1.

Furthermore, since it is possible to produce the wiring circuit board 1 of such a configuration using the above-described production method, it is also possible to achieve the fine pitch of the wiring support portions 112A, 112B, and 112C.

(5) According to the wiring circuit board 1, as shown in FIG. 2B, in the connecting portion 3A, the width W2 of the second metal support layer 12 is wider than the width W1 of the wiring support portion.

Therefore, in the connecting portion 3A, it is possible to stably support the wiring support portion 112A by the second metal support layer 12.

(6) According to the wiring circuit board 1, as shown in FIG. 2B, the bonding layer 13 which is disposed between the first metal support layer 11 and the second metal support layer 12 is further provided.

According to such a configuration, it is possible to ensure the bondability between the first metal support layer 11 and the second metal support layer 12.

4. Modified Examples

Next, modified examples are described. In each modified example, the same reference numerals are provided for members corresponding to each of those in the above-described embodiment, and their detailed description is omitted.

Figure 6A:
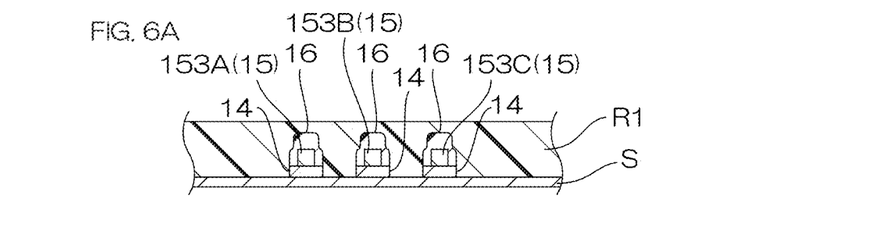

(1) As shown in FIG. 6A, before the deposition step, a thinning step of reducing the thickness of the substrate S may be also included. When the bonding layer forming step is carried out before the deposition step, the thinning step is carried out before the bonding layer forming step.

Specifically, in the thinning step, first, the plating resist R1 is formed on one surface of the substrate S in the thickness direction so as to cover the entire circuit pattern. Next, a portion of the substrate S in the thickness direction is wet-etched from the other side of the substrate S in the thickness direction. Thus, the thickness of the substrate S is reduced.

Figure 6B:
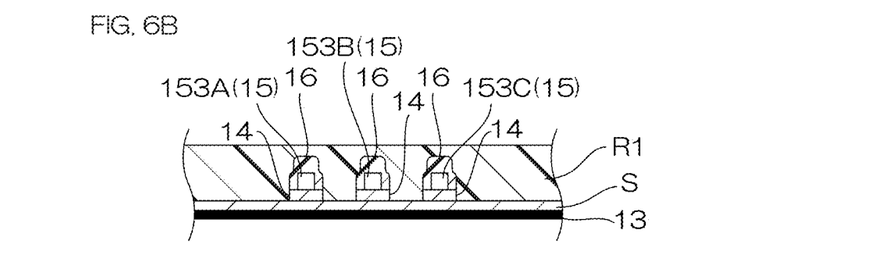
Figure 6C:
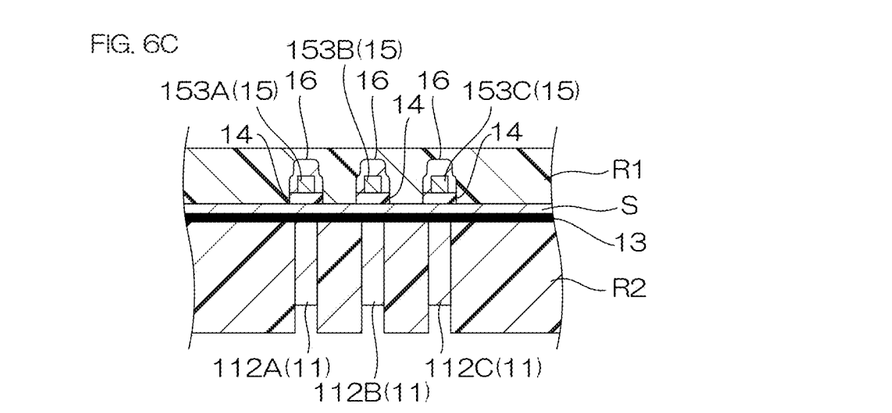
Figure 6D:
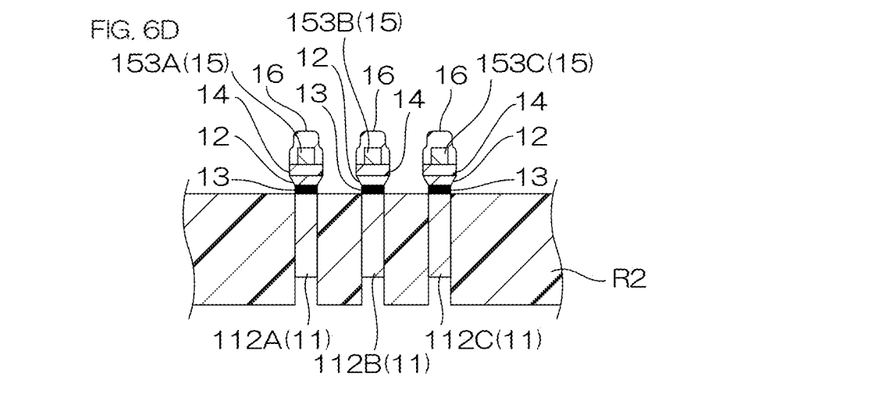

Next, in the same manner as in the above-described embodiment, as shown in FIG. 6B, the bonding layer 13 is formed on the other surface of the substrate S in the thickness direction (bonding layer forming step), as shown in FIG. 6C, the metal is deposited on the bonding layer 13 to form the first metal support layer 11 (deposition step), and thereafter, as shown in FIG. 6D, the substrate S is etched (etching step).

In this modified example, in the etching step, by etching the thinned substrate S, it is possible to form the second metal support layer 12.

Therefore, it is possible to shorten the etching step.

Figure 7A:
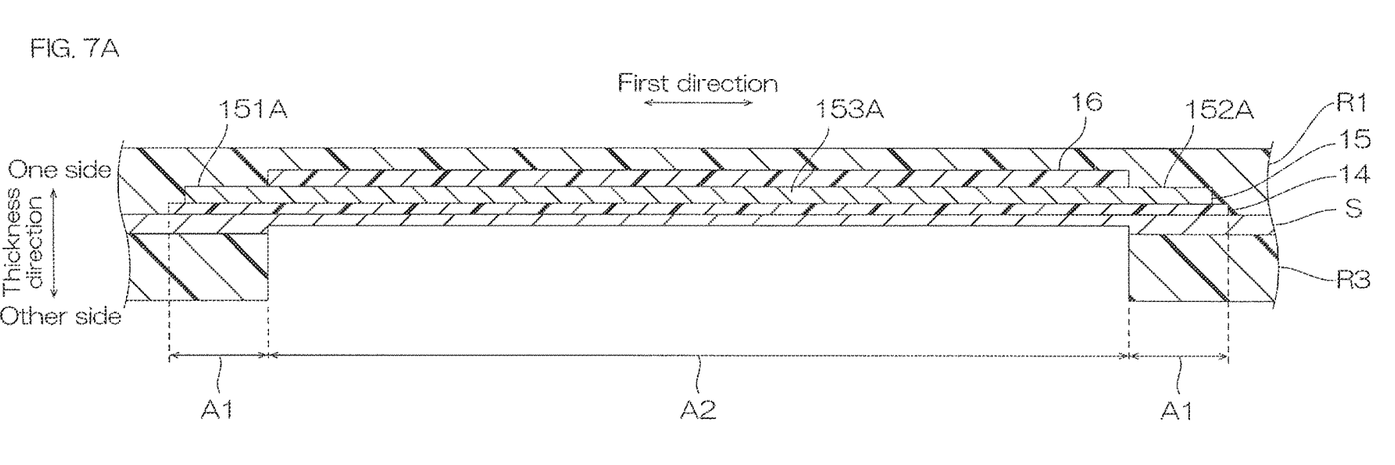
FIG. 7A shows an explanatory view for illustrating a thinning step in a method for producing a wiring circuit board of a modified example (2).

(2) As shown in FIG. 7A, in the thinning step, of the substrate S, the thickness of a second region A2 where the wiring support portions 112A, 112B, and 112C are formed may be also reduced without reducing the thickness of a first region A1 where the terminal support portions 111A and 111B are formed. In other words, the substrate S has the first region A1 where the terminal support portions 111A and 111B are formed, and the second region A2 where the wiring support portions 112A, 112B, and 112C are formed, and in the thinning step, the thickness of the second region A2 is reduced without reducing the thickness of the first region A1.

Specifically, in this modified example, in the thinning step, first, the plating resist R1 is formed on one surface of the substrate S in the thickness direction so as to cover the entire circuit pattern, and a plating resist R3 is formed on the other surface of the substrate S in the thickness direction so as to cover the first region A1 and to expose the second region A2. Next, the second region A2 of the substrate S is wet-etched from the other side of the substrate S in the thickness direction. Thus, the thickness of the second region A2 of the substrate S is reduced.

Next, the plating resist R3 is peeled, and in the same manner as in the above-described modified example (1), as shown in FIG. 6B, the bonding layer 13 is formed on the other surface of the substrate S in the thickness direction (bonding layer forming step); as shown in FIG. 6C, by depositing the metal on the bonding layer 13, the first metal support layer 11 is formed (deposition step); and thereafter, as shown in FIG. 6D, the substrate S is etched (etching step).

In this modified example, it is possible to shorten the etching step without reducing rigidity of the first region A1 supporting the terminals 151A, 151B, and 151C.

Figure 7B:
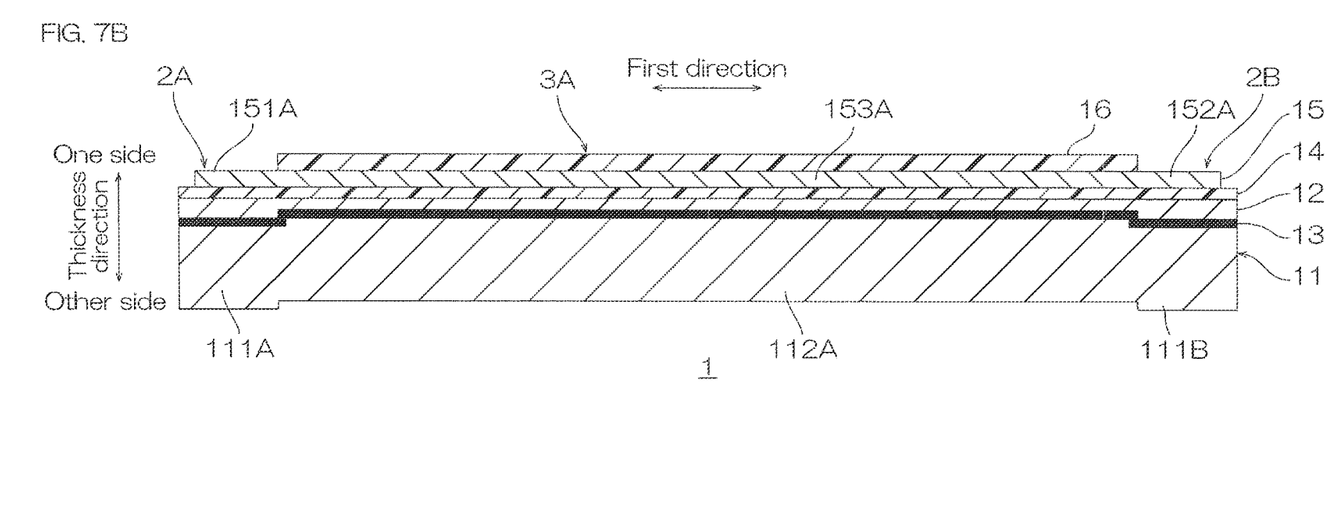
FIG. 7B shows a cross-sectional view of a wiring circuit board obtained by the method for producing a wiring circuit board of the modified example (2), and the cross-sectional view corresponds to the A-A line of FIG. 1.

In the wiring circuit board 1 obtained in the modified example, as shown in FIG. 7B, a thickness T12 of the metal layer of the connecting portions 3A, 3B, and 3C (total thickness of the first metal support layer 11, the second metal support layer 12, and the bonding layer 13) is thinner than a thickness T11 of the metal layer of the terminal arrangement portions 2A and 2B.

(3) The bonding layer forming step (ref: FIG. 5A) and the deposition step (ref: FIG. 5B) may be also carried out before the first pattern step (ref: FIG. 4B), the second pattern step (ref: FIG. 4C), and the third pattern step (ref: FIG. 4D).

Specifically, after the preparation step (ref: FIG. 4A), as shown in FIG. 5A, the bonding layer 13 is formed on the other surface of the substrate S in the thickness direction (bonding layer forming step), and next, as shown in FIG. 5B, the metal is deposited on the bonding layer 13 to form the first metal support layer 11 (deposition step).

Next, the first pattern step (ref: FIG. 4B), the second pattern step (ref: FIG. 4C), and the third pattern step (ref: FIG. 4D) are carried out in sequence to form the circuit pattern.

Thereafter, as shown in FIG. 5C, the substrate S is etched to form the second metal support layer 12.

Figure 8A:
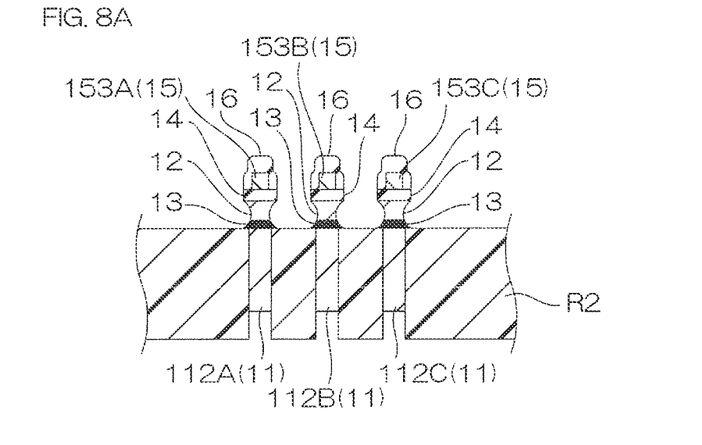
FIG. 8A shows an explanatory view for illustrating an etching step in a method for producing a wiring circuit board of a modified example (4).

(4) The shape of the second metal support layer 12 after the etching step is not limited. The second metal support layer 12 after the etching step may also have, for example, as shown in FIG. 5C, a tapered shape in which the width thereof becomes narrower toward the first metal support layer 11 in the thickness direction, or may also have, as shown in FIG. 8A, a constricted shape in which the width of the central part of the second metal support layer 12 in the thickness direction becomes narrower than the width of one end portion and the other end portion of the second metal support layer 12 in the thickness direction.

Figure 8B:
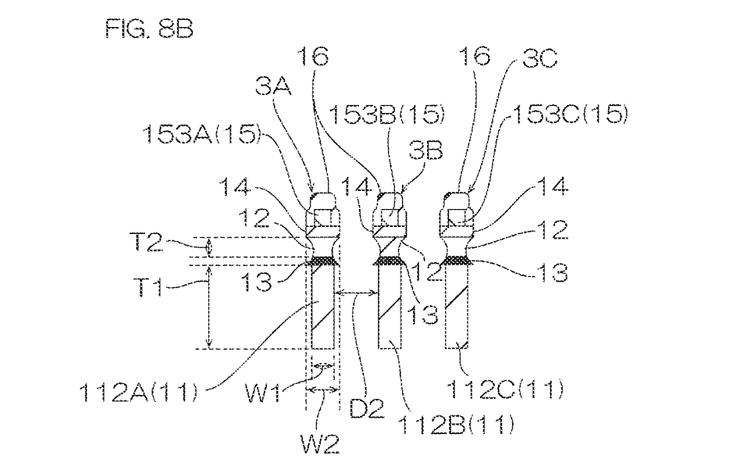
FIG. 8B shows a cross-sectional view of a wiring circuit board obtained by the method for producing a wiring circuit board of the modified example (4), and the cross-sectional view corresponds to the B-B line of FIG. 1.

When the second metal support layer 12 after the etching step has the constricted shape, as shown in FIG. 8B, the width of the other end portion of the second metal support layer 12 in the thickness direction may be also wider than the width W1 of the first metal support layer 11. Further, when the wiring circuit board 1 has the bonding layer 13, the width of the bonding layer 13 may be also wider than the width W1 of the first metal support layer 11.

(5) In the bonding layer forming step, it is not necessary to form the bonding layer 13 on the entire other surface of the substrate S in the thickness direction. The bonding layer 13 may be also pattern-formed in a portion where the first metal support layer 11 is formed in the deposition step.

Figure 9A:
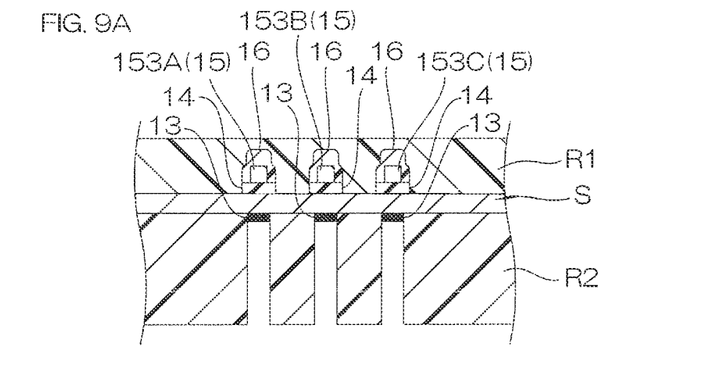
FIG. 9A shows an explanatory view for illustrating a bonding layer forming step in a method for producing a wiring circuit board of a modified example (5).

Specifically, as shown in FIG. 9A, in the bonding layer forming step, the above-described plating resist R1 is formed on one surface of the substrate S in the thickness direction, and the above-described plating resist R2 is formed on the other surface of the substrate S in the thickness direction.

Next, the bonding layer 13 is formed on the other surface of the substrate S exposed from the plating resist R2.

Figure 9B:
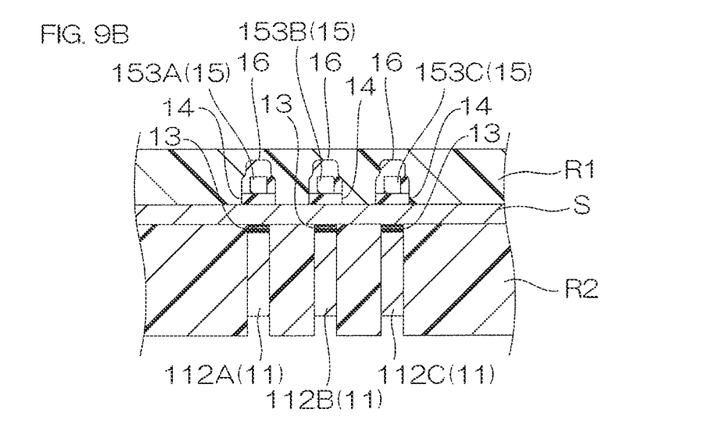
FIG. 9B shows an explanatory view for illustrating a deposition step in the method for producing a wiring circuit board of the modified example (5).

Next, as shown in FIG. 9B, the metal is deposited on the bonding layer 13 without peeling the plating resists R1 and R2 to form the first metal support layer 11 on the bonding layer 13.

(6) In the modified examples (1) to (5), the same function and effect as that of the above-described embodiment can be obtained.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The method for producing a wiring circuit board of the present invention is, for example, used in production of a wiring circuit board.

DESCRIPTION OF REFERENCE NUMERALS

1 Wiring circuit board
11 First metal support layer
12 Second metal support layer
13 Bonding layer
14 First insulating layer (one example of insulating layer)
15 Conductive pattern
111A Terminal support portion
112A Wiring support portion (one example of first wiring support portion)
112B Wiring support portion (one example of second wiring support portion)
151A Terminal (one example of first terminal)
151B Terminal (one example of second terminal)
153A Wiring (one example of first wiring)
153B Wiring (one example of second wiring)
A1 First region
A2 Second region
S Substrate
W1 Width of wiring support portion
W2 Width of second metal support layer

The invention claimed is:

1. A method for producing a wiring circuit board comprising:
a preparation step of preparing a substrate;
a first patterning step of forming an insulating layer on one side of the substrate in a thickness direction;
a second patterning step of forming a conductive pattern on one side of the insulating layer in the thickness direction, the conductive pattern having a first terminal, a second terminal, a first wiring connected to the first terminal, and a second wiring connected to the second terminal and disposed spaced from the first wiring; and
a deposition step of depositing a metal on the other side of the substrate in the thickness direction to form a first metal support layer having a terminal support portion supporting the first terminal and the second terminal, a first wiring support portion supporting the first wiring, and a second wiring support portion supporting the second wiring and disposed spaced from the first wiring support portion.

2. The method for producing a wiring circuit board according to claim 1 further comprising:
an etching step of etching the substrate to form a second metal support layer disposed between the first metal support layer and the insulating layer after the deposition step.

3. The method for producing a wiring circuit board according to claim 1 further comprising:
a bonding layer forming step of forming a bonding layer made of a metal on the other surface of the substrate in the thickness direction before the deposition step, wherein
in the deposition step, the first metal support layer is formed on the bonding layer.

4. The method for producing a wiring circuit board according to claim 1 further comprising:
a thinning step of reducing a thickness of the substrate before the deposition step.

5. The method for producing a wiring circuit board according to claim 4, wherein
the substrate has a first region in which the terminal support portion is formed and a second region in which the first wiring support portion and the second wiring support portion are formed, and
in the thinning step, a thickness of the second region is reduced without reducing the thickness of the first region.

6. A wiring circuit board comprising:
an insulating layer;
a conductive pattern disposed on one side of the insulating layer in a thickness direction and having a first terminal, a second terminal, a first wiring connected to the first terminal, and a second wiring connected to the second terminal and disposed spaced from the first wiring;
a first metal support layer disposed on the other side of the insulating layer in the thickness direction and having a terminal support portion supporting the first terminal and the second terminal, a first wiring support portion supporting the first wiring, and a second wiring support portion supporting the second wiring and disposed spaced from the first wiring support portion; and
a second metal support layer disposed between the first metal support layer and the insulating layer, wherein
the first metal support layer is thicker than the second metal support layer.

7. The wiring circuit board according to claim 6, wherein
a width of the second metal support layer is wider than the width of each of the first wiring support portion and the second wiring support portion on each of the first wiring support portion and the second wiring support portion.

8. The wiring circuit board according to claim 6 further having
a bonding layer disposed between the first metal support layer and the second metal support layer.

* * * * *